(12) United States Patent
Bykanov et al.

(10) Patent No.: US 9,295,147 B2
(45) Date of Patent: Mar. 22, 2016

(54) EUV LIGHT SOURCE USING CRYOGENIC DROPLET TARGETS IN MASK INSPECTION

(71) Applicant: KLA-Tencor Corporation, Milpitas, CA (US)

(72) Inventors: Alexander Bykanov, San Diego, CA (US); Oleg Khodykin, San Diego, CA (US); Daniel Christopher Wack, Fredericksburg, VA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 0 days.

(21) Appl. No.: 14/180,107

(22) Filed: Feb. 13, 2014

(65) Prior Publication Data

US 2014/0246607 A1  Sep. 4, 2014

Related U.S. Application Data

(63) Continuation of application No. PCT/US2014/013963, filed on Jan. 30, 2014.

(60) Provisional application No. 61/758,552, filed on Jan. 30, 2013.

(51) Int. Cl.

| H05G 2/00 | (2006.01) |
|---|---|
| G03F 1/22 | (2012.01) |
| G03F 1/84 | (2012.01) |
| G03F 7/20 | (2006.01) |
| H01L 21/027 | (2006.01) |

(52) U.S. Cl.
CPC ............... *H05G 2/006* (2013.01); *G03F 1/22* (2013.01); *G03F 1/84* (2013.01); *G03F 7/20* (2013.01); *H01L 21/027* (2013.01); *H05G 2/008* (2013.01); *Y10T 137/206* (2015.04)

(58) Field of Classification Search
CPC ....... H05G 2/008; H05G 2/003; H05G 2/005; H05G 2/00; H05G 2/001; G03F 7/70033; G21K 5/00; G01N 15/147
USPC ............... 250/504 R, 493.1, 503.1, 365, 372, 250/492.1, 492.2; 378/119, 143
See application file for complete search history.

(56) References Cited

U.S. PATENT DOCUMENTS

| 5,226,948 A | 7/1993 | Orme et al. |
| 5,259,593 A | 11/1993 | Orme et al. |
| 5,340,090 A | 8/1994 | Orme et al. |

(Continued)

FOREIGN PATENT DOCUMENTS

| WO | 2013029896 A1 | 3/2013 |
| WO | 2013131706 A1 | 9/2013 |

*Primary Examiner* — David A Vanore
(74) *Attorney, Agent, or Firm* — Simpson & Simpson, PLLC (57) ABSTRACT

An apparatus for generating extreme ultra-violet (EUV) light, including a drive laser arranged to produce a laser pulse, a vacuum chamber, a set of focusing optics arranged to focus the laser pulse produced by the drive laser onto a target spot within the vacuum chamber, a target material generator arranged to deliver a series of droplets of a target material to the target spot by modulating a flow velocity of a supply of the target material through a nozzle tip and thereby inducing a formation process of the series of droplets which series of droplets from the nozzle tip are expelled through a triple point chamber, and a set of collector optics arranged to focus a quantity of EUV light generated when a droplet of the series of drople of the target material is exposed to the laser pulse at the target spot onto an intermediate focus spot.

29 Claims, 4 Drawing Sheets

(56) References Cited

U.S. PATENT DOCUMENTS

| | | |
|---|---|---|
| 6,452,194 B2 | 9/2002 | Bijkerk et al. |
| 6,657,213 B2* | 12/2003 | Orsini et al. ............... 250/504 R |
| 6,738,452 B2 | 5/2004 | McGregor et al. |
| 6,835,944 B2* | 12/2004 | Orsini et al. ............... 250/504 R |
| 6,882,704 B2* | 4/2005 | Schriever et al. ............. 378/119 |
| 6,973,164 B2* | 12/2005 | Hartlove ................ H05G 2/008 372/5 |
| 7,087,914 B2* | 8/2006 | Akins et al. ............... 250/504 R |
| 7,164,144 B2* | 1/2007 | Partlo et al. ............... 250/504 R |
| 7,306,015 B2 | 12/2007 | Ter-Avetisyan et al. |
| 7,317,196 B2 | 1/2008 | Partlo et al. |
| 7,378,673 B2 | 5/2008 | Bykanov et al. |
| 7,482,609 B2 | 1/2009 | Ershov et al. |
| 7,758,811 B2* | 7/2010 | Durack et al. .................. 422/73 |
| 8,164,076 B2* | 4/2012 | Endo et al. ................ 250/504 R |
| 8,324,600 B2 | 12/2012 | Hayashi et al. |
| 8,530,871 B2 | 9/2013 | Vaschenko |
| 8,669,543 B2* | 3/2014 | Yanagida et al. ......... 250/504 R |
| 8,680,495 B1* | 3/2014 | Tao et al. .................. 250/504 R |
| 8,791,440 B1* | 7/2014 | Tao et al. .................. 250/504 R |
| 8,872,143 B2* | 10/2014 | Rafac et al. ............... 250/504 R |
| 8,885,680 B2* | 11/2014 | Nakarai et al. ........... 372/29.014 |
| 2001/0004104 A1* | 6/2001 | Bijkerk et al. ............. 250/492.2 |
| 2001/0036424 A1 | 11/2001 | Takahashi et al. |
| 2003/0223542 A1 | 12/2003 | Shields |
| 2006/0017026 A1 | 1/2006 | Hergenhan et al. |
| 2006/0057554 A1* | 3/2006 | Watling et al. .................... 435/4 |
| 2006/0133574 A1* | 6/2006 | Nagai et al. .................... 378/119 |
| 2006/0192152 A1* | 8/2006 | Ershov et al. ............. 250/503.1 |
| 2007/0001131 A1* | 1/2007 | Ershov et al. ............. 250/503.1 |
| 2008/0237498 A1* | 10/2008 | MacFarlane ............... 250/493.1 |
| 2008/0315126 A1 | 12/2008 | Toki |
| 2010/0018584 A1 | 1/2010 | Bransky et al. |
| 2010/0220756 A1* | 9/2010 | Krzysztof et al. ......... 372/38.02 |
| 2012/0280149 A1 | 11/2012 | Mestrom et al. |
| 2014/0326904 A1* | 11/2014 | Ceglio et al. ............. 250/504 R |
| 2015/0043599 A1* | 2/2015 | Yanagida et al. ............... 372/18 |

\* cited by examiner

EUV LIGHT SOURCE USING CRYOGENIC DROPLET TARGETS IN MASK INSPECTION

CROSS-REFERENCE TO RELATED APPLICATIONS

This application is a Continuation of International Patent Application Serial No. PCT/US2014/0013963, filed on Jan. 30, 2014, which application claims priority of U.S. Provisional Patent Application No. 61/758,552, filed Jan. 30, 2013, which applications are incorporated herein by reference in their entirety.

TECHNICAL FIELD

The present disclosure relates to an extreme ultra-violet (EUV) light source used for the inspection of masks used in photolithography. In particular, the present disclosure relates to an apparatus for generation of droplets of cryogenic liquid that are subsequently converted to plasma by a driver laser in order to produce EUV light.

BACKGROUND

EUV light, which is defined as electromagnetic radiation with wavelengths between 124 nm and 10 nm, is used in next-generation photolithography systems to produce structures smaller than is possible with current ultra-violet light sources, such as excimer lasers. However, EUV light is more difficult to generate than the ultra-violet light used in current photolithography systems. EUV light sources for photolithography systems commonly use a laser to transform xenon or tin into plasma, which plasma then emits radiation in the EUV portion of electromagnetic spectrum.

There are several disadvantages associated with this type of laser produced plasma EUV light source. In order to have sufficient photolithographic throughput, the EUV light source must have high average power (100 W or above). However, to achieve this level of EUV light output, the driver laser used to generate the plasma must have an output of greater than 10 kW. Given the typical efficiencies of the solid state lasers used as driver lasers in EUV light generation, a laser produced plasma EUV light source with an output of 100 W may use in excess of 200 kW "at the wall." As the predominant commercial use for EUV light sources is in photolithography systems, most EUV light sources are designed to have high EUV light output (100 W or above) and thus have a correspondingly enormous energy requirement. Further, given the high costs associated with building EUV light sources and the lack of low-power alternatives, even in applications in which high output EUV light is not required, EUV light sources with high output are used.

Additionally, such laser produced plasma EUV light sources can use tin or other metals as the driver laser target material. The process of converting the metal target to plasma creates both micro-particles of the original target and metal vapor after the plasma has cooled. Both of these byproducts foul the optics and vacuum chamber of the EUV light source, necessitating difficult and costly maintenance to remove the metal deposits.

Even in laser produced plasma EUV light sources that use xenon or other gases as the driver laser target, not all of the target gas that is injected into the vacuum chamber, usually in the form of cryogenic droplets, is successfully converted to plasma. The droplets may not intersect with the driver laser pulse, as in the case when the droplet injection stream is inaccurately timed or aimed. Also, to increase the odds that a driver laser pulse always strikes a droplet, droplets may be injected into the vacuum chamber at a higher rate than can be reacted upon by the driver laser. This over supply of droplets may also result from the method of droplet generation, which relies on stimulation of a gas supply nozzle at the natural frequency associated with the gas. As EUV light is strongly absorbed by most materials, including gases, the excess gas injected into the vacuum chamber only serves to attenuate the EUV light that is generated.

Thus, what is needed is a laser produced plasma EUV light source for applications that do not require high EUV light output that does not have the high operating costs of high-power EUV light sources and that efficiently use the driver laser target material so as not to attenuate the generated EUV light or require frequent costly maintenance.

SUMMARY

According to aspects illustrated herein, there is provided an apparatus for generating extreme ultra-violet (EUV) light for use in a lithography inspection tool, including a driver laser arranged to produce a laser pulse, a vacuum chamber, a set of focusing optics arranged to focus the laser pulse produced by the driver laser onto a target spot within the vacuum chamber with a beam target diameter of less than 100 μm, a target material generator arranged to deliver an amount of a target material to the target spot within the vacuum chamber, and a set of collector optics arranged to focus a quantity of EUV light generated when the amount of the target material is exposed to the laser pulse at the target spot onto an intermediate focus spot.

According to aspects illustrated herein, there is provided an apparatus for generating droplets for use in a laser produced plasma EUV light source, including a triple point chamber arranged to provide an environment comprising a temperature and pressure combination and having a traversal length measured axially along a central axis of the triple point chamber, a sensor arranged within the triple point chamber and further arranged to measure the temperature and pressure combination, an environmental control means arranged to receive a signal from the sensor and adjust the environment to conform to a predefined set of values for the temperature and pressure combination, an exit orifice arranged at a distal end of the triple point chamber, a source vessel arranged at a proximal end of the triple point chamber, a nozzle tip arranged at a distal end of the source vessel, a target material source containing a first supply of a target material arranged at the proximal end of the source vessel, and a piezoelectric actuator arranged to vibrate and induce a formation process of a series of droplets of the target material from the first supply of the target material from the target material source and expel the series of droplets from the nozzle tip through the triple point chamber and out the exit orifice.

According to aspects illustrated herein, there is provided a channeled aperture for accelerating droplets for use in a laser produced plasma extreme ultra-violet (EUV) light source, including an entrance aperture proximal to a triple point chamber, an exit aperture distal to a triple point chamber, a channel arranged to connect the entrance aperture to the exit aperture and having a channel profile and a channel axis, a gas jet having a flow from the triple point chamber to a vacuum chamber and through the channel, and a target material droplet, wherein the channel profile is arranged to accelerate the gas jet during the flow from the triple point chamber to the vacuum chamber, which acceleration generally accelerates the target material droplet in a direction coincident to a direction associated with the flow from the triple point chamber to the vacuum chamber.

These and other objects and advantages of the present disclosure will be readily appreciable from the following description of the invention and from the accompanying drawings and claims.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

At the outset, it should be appreciated that like drawing numbers on different drawing views identify identical, or functionally similar, structural elements of the disclosure. It is to be understood that the disclosure as claimed is not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the present disclosure.

Unless defined otherwise, all technical and scientific terms used herein have the same meaning as commonly understood to one of ordinary skill in the art to which this disclosure belongs. It should be understood that any methods, devices or materials similar or equivalent to those described herein can be used in the practice or testing of the disclosure. As used herein, by "droplet," it is generally meant a small amount of material that will be acted upon by radiation emitted from a laser and thereby converted to plasma. A "droplet" may exist in gas, liquid, or solid phases. By "pellet," it is generally meant a droplet that is in a solid phase, such as by freezing upon moving into a vacuum chamber.

Figure 1:
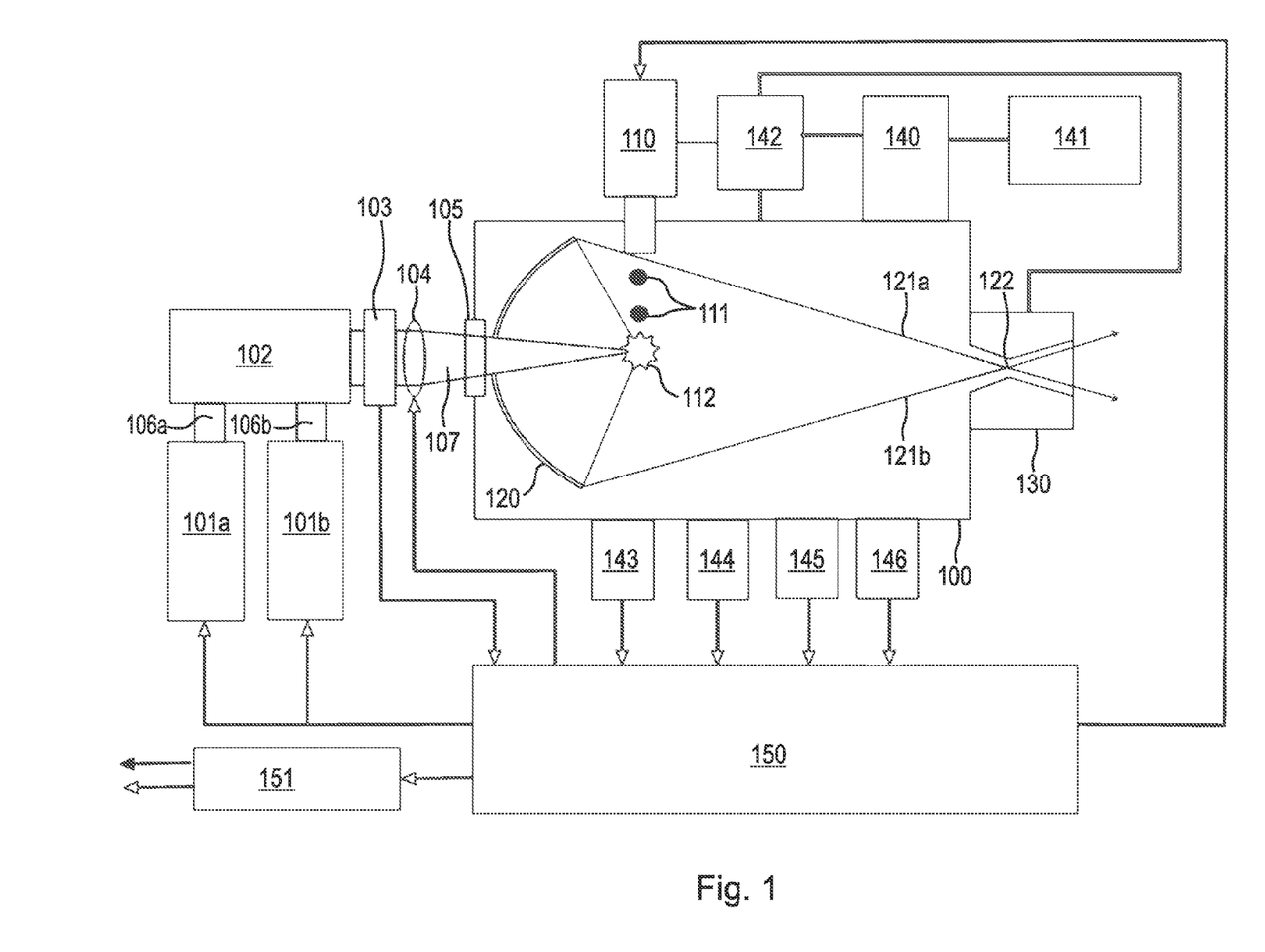
FIG. 1 is a schematic representation of an apparatus for generating extreme ultra-violet (EUV) light.

FIG. 1 is a schematic representation of an apparatus for generating extreme ultra-violet (EUV) light. EUV light, which is defined as electromagnetic radiation with wavelengths between 124 nm and 10 nm, is used in next-generation photolithography light sources to produce structures smaller than is possible with current ultra-violet light sources, such as excimer lasers. The apparatus depicted in FIG. 1 is specifically used for applications requiring low average EUV light power (below 10 W), unlike EUV light sources used in photolithography, where the power requirements are usually greater than 100 W. Using an EUV light source with an application-appropriate power level, as opposed to using an EUV light source that provides more power than is needed, has several advantages, including reducing the overall cost of the light source system, reducing the cost of operation of such a light source, and reducing the complexity of the debris mitigation system which handles the debris created by the laser-produced plasma EUV light generation process.

Vacuum chamber 100 is a low pressure container in which the plasma that serves as the EUV light source is created and the resulting EUV light is collected and focused. EUV light is strongly absorbed by gases, thus, reducing the pressure within vacuum chamber 100 reduces the attenuation of the EUV light within the light source. A buffer gas, such as hydrogen, helium, argon, or other inert gases, may be used within the vacuum chamber.

Drive lasers 101a and 101b are used to supply the energy required to rapidly heat the target material to a plasma, which plasma then emits EUV light. One or more drive lasers may be used, depending on the power output of the individual lasers, the desired EUV light power output, and the efficiency of the EUV light generation process. As an example, EUV light is used by photolithography mask inspection systems, but such systems do not need the high EUV light power output of primary photolithography systems. An EUV mask inspection system may only require EUV light in the range of 10 W, though with high brightness in a small area. In this case, to generate EUV light of sufficient power and brightness for a mask inspection system, total laser output in the range of a few kilowatts is needed, which output is focused onto a small target spot, optimally less than 100 µm in diameter.

The drive lasers should have a wavelength of 1 µm or less, which characteristic is common among solid state lasers. Suitable lasers include Nd:YAG, Er:YAG, Yb:YAG, Ti:Sapphire, Nd:Vanadate, and others. Gas-discharge lasers, including excimer lasers, may also be used if they provide sufficient output at the required wavelength.

Drive lasers 101a and 101b emit radiation 106a and 106b, which is then combined by beam combiner 102. Beam combiner 102 may also provide beam conditioning, such as beam expansion or collimation. Combined beam 107 is then emitted by beam combiner 102 through beam diagnostic tool 103, which measures information about the beam, such as its direction, temporal characteristics, and quality, and transmits this information to control system 150 for possible adjustment, such as focusing the beam with focusing optics 104. This information may also be recorded or used for safety monitoring of the light source.

After combined beam 107 passes through diagnostic tool 103, it is focused with focusing optics 104 onto a target spot 112 within vacuum chamber 100. Focusing optics 104 can be adjusted to change the directional and focus properties of combined beam 107. As discussed above, it is advantageous for target spot 112 within vacuum chamber 100 to have a diameter of less than 100 µm. Focusing combined beam 107 this tightly also provides inherent protection for the optics and reduces the required diameter of the set of collector optics 120. The requirement that the drive laser or lasers emit light with a wavelength of 1 µm an or less is in order to limit the diffraction when target point 112 is less than 100 µm in diameter.

In order to maintain the low pressure environment inside vacuum chamber 100, combined beam 107 passes through vacuum window 105. Vacuum window 105 may also be part of focusing optics 104. If multiple drive lasers are used, but the emitted beams are not combined, multiple vacuum windows may be used to allow the individual beams to pass into vacuum chamber 100.

Target material generator 110 is arranged to deliver an amount of target material 111, either in pellet or jet form, into vacuum chamber 100. Target material 111 is delivered in such a way that a pellet or portion of the jet will intersect target spot 112 at the same time as combined beam 107 is focused onto target spot 112. As an example target material 111 may comprise pellets of liquid or solid xenon, though target material 111 may comprise other materials suitable for conversion to plasma, such as other gases or tin. Directional adjustments to target material generator 110 are controlled by control system 150. These directional adjustments control where in vacuum chamber 100 target material 111 is delivered.

Upon being struck by combined beam 107 at target spot 112, the target material is quickly converted to plasma. This plasma emits radiation in the EUV band of the electromagnetic spectrum with relatively high conversion efficiency. Target spot 112, the location of the plasma, is a first focal point of collector optics 120, which comprise a segment of a prolate spheroid having two focal points. The collector optics 120 have a high-quality polished surface coated with a multilayer mirror (e.g., Mo/Si or NbC/Si) optimized for in-band EUV reflection. EUV radiation emitted from plasma and reflected by collector optics 120, as defined by extreme rays 121a and 121b, is focused to intermediate focus spot 122.

The EUV beam at intermediate focus spot 122 is projected into internal focus module 130. Internal focus module 130 collects and refocuses the EUV light, serves as a dynamic gas lock to preserve the low-pressure environment within vacuum chamber 100, and protects the systems that use the resulting EUV light from any debris generated by the plasma creation process.

Gas management within vacuum chamber 100 is controlled by gas supply system 142, which provides target material generator 110 with a supply of target material 111. Gas supply system 142 also controls injection of protective buffer gas into vacuum chamber 100, which buffer gas also serves to protect the dynamic gas lock function of internal focus module 130. To limit the use of target material 111, target material recycling system 140 recovers target material from vacuum chamber 100 and resupplies it to gas supply system 142. Vacuum system 141 provides the vacuum required to maintain the low pressure environment of vacuum chamber 100 and to recover target material and buffer gas from vacuum chamber 100.

Target material sensor 143 is arranged to determine when an amount of target material 111 is located at target spot 112. If drive lasers 101a and 101b are activated without an amount of target material 111 at target spot 112, combined beam 107 may instead strike other surfaces within the vacuum chamber and damage the internal components of the light source. To prevent this damage, drive lasers 101a and 101b are activated only when target material sensor 143 determines that an amount of target material 111 is located at target spot 112. Diagnostic tool 144 can be used for optical and/or EUV plasma imaging, pellet imaging, and pellet position determination, which information can be used to adjust target material generator 110 and focusing optics 104. EUV power meter 145 measures the EUV light power output. Gas monitoring sensor 146 measures the temperature and pressure of the gas within vacuum chamber 100. All of the foregoing sensors transmit their respective information to control system 150, which controls real-time data acquisition and analysis, data logging, and real-time control of the various EUV light source sub-systems, such as drive lasers 101a and 101b and target material generator 110. Control system 150 also controls temperature management system 151, which serves to monitor and regulate the temperature of the EUV light source.

Figure 2A:
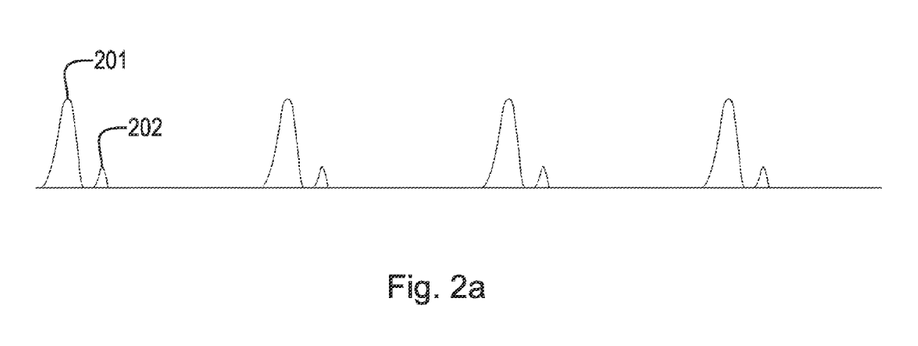
FIG. 2a is an example waveform illustrating grouped laser pulses with a pre-pulse followed by a main pulse.
Figure 2B:
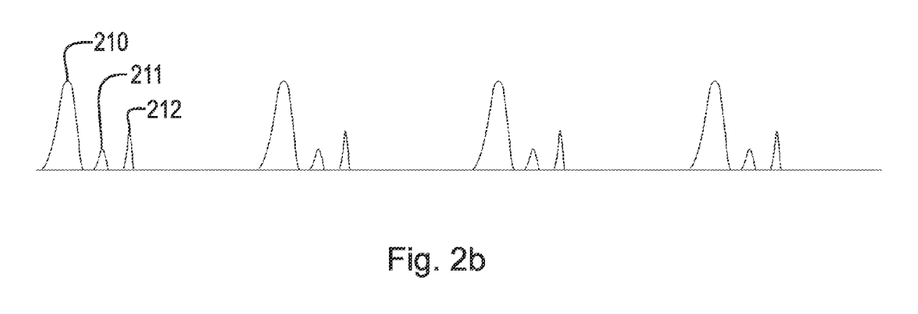
FIG. 2b is an example waveform illustrating grouped laser pulses with two pre-pulses followed by a main pulse.
Figure 2C:
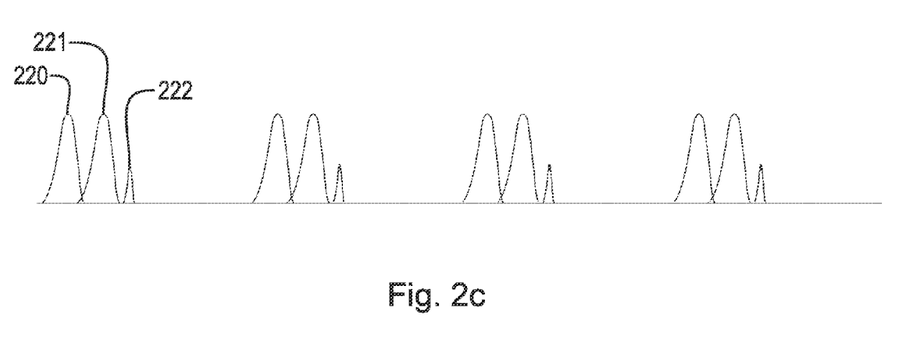
FIG. 2c is an example waveform illustrating grouped laser pulses with a pre-pulse followed by two main pulses.

FIG. 2a is an example waveform that shows the variation in intensity of a laser pulse over its duration. Pre-pulse 202 is a laser pulse that is emitted with less than full intensity immediately prior to main pulse 201, which is emitted with full intensity. FIG. 2b is an example waveform that shows a first pre-pulse 212 with a first fractional intensity, a second pre-pulse 211 with a second fractional intensity, and a main pulse 210 with full intensity. FIG. 2c is an example waveform that shows a pre-pulse 222 with fractional intensity, followed by two main pulses 220 and 221 with full intensity. Varying the intensity within a single laser pulse provides control over the plasma generation process, and parameters of the pulses and pre-pulses such as energy distribution between pulses, pulse durations, delays may be adjusted for optimal system performance.

As discussed above, laser produced plasma EUV light sources may use xenon as the target material for plasma generation. In this case, in order to be effective as a target material, the xenon must have relatively high density, approximately, $10^{20}$ atoms/cm$^3$. Such densities are only feasibly obtained by liquid or solid xenon. A preferred method for delivering the target material to the point of interaction with laser radiation is production of a jet of droplets, each with a diameter ranging from 50 µm to 150 µm and having a speed of 10 m/s to 50 m/s. Droplets are typically formed by natural breaks in a jet of the target material in the liquid phase caused by passing the jet through a nozzle. Although passing the jet through the nozzle will naturally produce droplets of the target material, a piezoelectric actuator attached to the nozzle provides stable generation of the droplets and allows for varying the frequency of droplet formation near the natural formation frequency.

Total flow of the target material into the vacuum chamber in which the plasma is generated is proportional to the volume of the individual droplets and the rate of droplet generation. Total flow is a product of the area of the nozzle used to generate the droplets, jet velocity, and the density of the target material. However, creating droplets near the natural frequency narrows the possible ranges for droplet diameter and spacing control with varying jet velocity. For example, to create a 100 µm droplet at 30 m/s, a nozzle with a diameter of approximately 50 µm must be used, and separation between droplets will be approximately 2.4 of droplet diameter. In this case, the natural frequency will be approximately 130 kHz, and given a laser activating at a typical rate of 10 kHz, only every 13$^{th}$ droplet will be converted to plasma, while the remainder of the droplets will evaporate in the vacuum chamber. High concentrations of xenon in the vacuum chamber significantly attenuate the generated EUV light, as EUV light is strongly absorbed by gas.

Droplets of cryogenic liquids, such as liquid xenon, are typically formed within a triple point chamber rather than directly in the vacuum chamber where the now-frozen pellets are converted to plasma. The low pressure environment of the vacuum chamber will cause the ejected liquid to undergo intensive evaporation, resulting in rapid cooling and freezing, which limits the droplet formation process. By forming droplets in a triple point chamber, which is a sealed vessel that is kept near the temperature and pressure of the triple point of the target material that, the droplets do not immediately freeze upon creation, and instead, stabilize before they are ejected into the vacuum chamber. As an example, the triple point for xenon is approximately 161.4 K and 612 Torr. The length of the a triple point chamber is typically chosen so that it is just long enough for droplet formation, which is generally less than 1 cm.

Figure 3A:
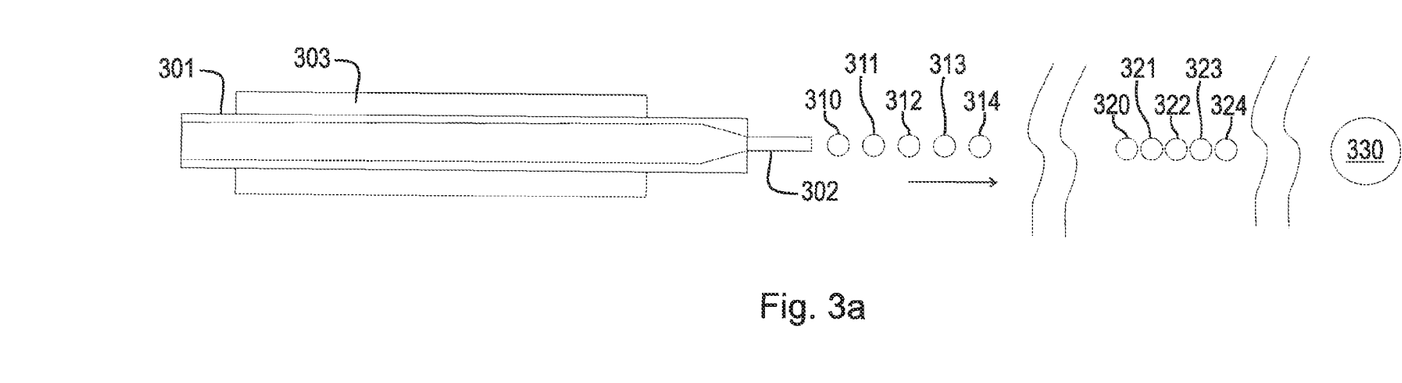
FIG. 3a is a schematic cross-sectional representation of an apparatus for generating droplets for use in a laser produced plasma EUV light source.

FIG. 3a is a schematic cross-sectional representation of an apparatus for generating droplets for use in a laser produced plasma EUV light source. Target material source 301 feeds a constant supply of the target material used in the EUV light source through nozzle tip 302. Piezoelectric actuator 303 modulates the flow velocity of target material through nozzle tip 302 to form droplets of the target material from the jet of target material provided by target material source 301.

Figure 3B:
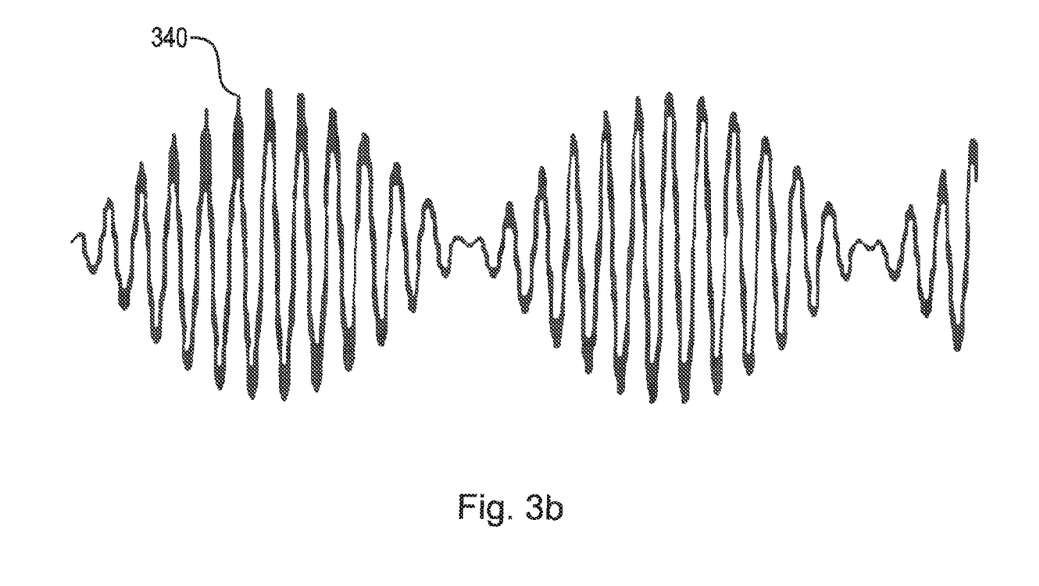
FIG. 3b is an example waveform illustrating the vibrations used for droplet generation and speed modification in the droplet generating apparatus.

Referring now to FIG. 3b, piezoelectric actuator 303 modulates the flow velocity of target material through nozzle tip 302 as illustrated by waveform 340. The frequency of the fine sine wave component of waveform 340 corresponds to the fundamental frequency that will induce droplet formation at the given conditions and configuration of the droplet generation apparatus. As an example, when using xenon at 161.4 K with a 30 m/s flow velocity through a 20 μm nozzle, the fundamental frequency is 330 kHz. The frequency of the coarse sine wave component of waveform 340 corresponds to a stimulation frequency, which is used to alter the speed at which the droplets produced by the vibrations at the fundamental frequency are ejected from the nozzle. As illustrated by waveform 340, for every 11 cycles of the fundamental frequency, which corresponds to generation of 11 droplets, there is a single cycle of the stimulation frequency, corresponding to a stimulation frequency of 30 kHz. The sinusoidal modulation of the amplitude of the fundamental frequency by the stimulation frequency causes small variations of initial droplet velocity compared to a nominal velocity, in which the variations are both positive and negative. Although FIG. 3b depicts a sinusoidal modulation of the amplitude of the fundamental frequency waveform, the modulation may also comprise modulation by rectangular wave or other wave shapes, and the modulation may affect the phase, frequency, or amplitude, or any combinations thereof, of the fundamental frequency waveform. The differences in velocity cause the earlier formed droplets to move slower than the later formed droplets, such that the individual droplets in the series of droplets tend to converge, and upon contacting, coalesce into a single, large droplet.

Referring now again to FIG. 3a, droplets 310 through 314 have recently been generated and are traveling away from nozzle 302 and through a triple point chamber. Droplets 310 and 311, due to the stimulation frequency portion of the vibrations used by piezoelectric actuator 303 to generate droplets 310 through 314, have a greater velocity than droplets 312 through 314. Likewise, again due to the stimulation frequency portion of the vibrations used by piezoelectric actuator 303 to generate droplets 310 through 314, droplets 313 and 314 have a lesser velocity than droplets 310 through 312. These relative differences in velocity tend to cause droplets 310 through 314 to converge. Droplets 320 through 324 depict a similarly generated set of droplets having travelled farther in the triple point chamber, showing how the relative differences in velocity have caused the droplets to converge. Large droplet 330 is the ultimate result of this convergence. Upon making contact, individual droplets will couple and coalesce into a larger droplet, such as large droplet 330, with a velocity proportional to the velocities of the component droplets. Eventually, given enough travel length within the triple point chamber, all droplets generated in the same cycle of the stimulation frequency will couple and coalesce into a large droplet. For example, the length of the triple point chamber may need to be extended from 1 cm to 10-30 cm to allow for coalescence.

This type of combining has three primary advantages for the generation of EUV light. First, it reduces the percentage of droplets that evaporate without being used in plasma production. As depicted in waveform 340, droplets generated by a fundamental frequency of 330 kHz and stimulation with a stimulation frequency of 30 kHz will form large droplets from coupled groups of 11 if given enough travel distance. This changes the 330 kHz nominal droplet creation rate to a 30 kHz effective droplet creation rate. At this effective rate, given a laser activating at a typical rate of 10 kHz, every $3^{rd}$ droplet will be converted to plasma, as opposed to every $33^{rd}$ if the droplets did not couple. This reduces the percentage of droplets that evaporate without being used in plasma production from 97% to 67%.

Second, by combining a plurality of smaller droplets into a series of larger droplets that arrive less frequently than would large droplets generated without such combination, it is possible to reduce the flow rate of the target material into the light source. This reduction results from the reduction in nozzle aperture size needed to produce smaller droplets. The reduction in flow rate is proportional to the square of the reduction in diameter of the nozzle aperture. As an example, when compared to a baseline droplet, reducing the diameter of the nozzle aperture by a factor of two produces droplets having one eighth the volume of the baseline droplet, and the total flow rate is reduced by a factor of four. Eight of these smaller droplets can then be combined into a single droplet of the same volume as the baseline droplet. Reducing the target material flow rate is beneficial, as it reduces EUV attenuation within the light source due to absorption by target material and the cost to operate the light source. Finally, altering the flow speed and nozzle geometry to support droplet coupling reduces the Reynolds number of the target material flow by a factor of 2.5, bringing operation of the jet closer to the laminar flow regime.

Figure 4A:
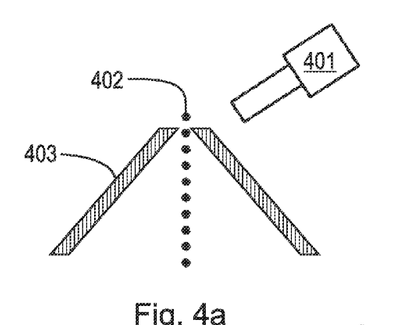
FIG. 4a is a schematic cross-sectional representation of an existing aperture used to inject droplets into a vacuum chamber.

FIG. 4a is a schematic cross-sectional representation of an existing aperture used to inject droplets into a vacuum chamber for use in a laser produced plasma EUV light source. Aperture 403 is frustoconical shell with the narrow opening arranged at the distal end of a triple point chamber in which droplets of a target material are formed. Droplet jet 402 is ejected from the triple point chamber through the narrow opening (with a diameter in the range of several hundred micrometers) of aperture 403 and travels through the rapidly widening shell. As aperture 403 connects a triple point chamber, which is filled with gas phase target material at approximately the temperature and pressure of the target material's triple point, to a vacuum chamber, which is at comparatively low pressure, some gas from the triple point chamber escapes with droplet jet 402. This escaping jet of gas briefly interacts with droplet jet 402 as it flows through the narrow opening of aperture 403, increasing the velocity of the individual droplets. However, its ability to alter the velocity of droplet jet 402 is reduced as the opening widens. Imaging unit 401 measures spatial information about the droplets as they pass through aperture 403. Based on this spatial information, the position of aperture 403 can be altered, to ensure that the droplets ejected from the triple point chamber do not impact with aperture 403.

Aperture 403 functions as a "skimmer," namely, it allows the droplets formed in the triple point chamber to pass through to the vacuum chamber, while limiting the amount of gas is ejected from the triple point chamber into the vacuum chamber. However, other than providing an opening through which droplets can pass, aperture 403 does not appreciably affect the velocity of the droplets.

Figures 4B, 4D:
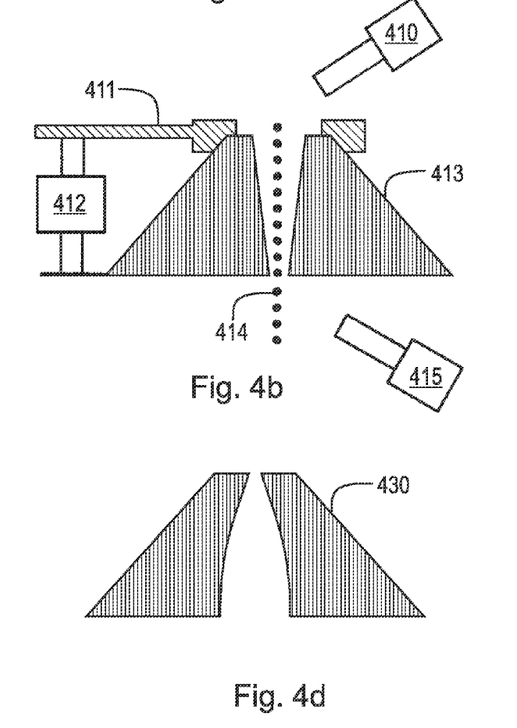
FIG. 4b is a schematic cross-sectional representation of a channeled aperture with a narrowing conical channel and an actuator used to position the channeled aperture.
FIG. 4d is a schematic cross-sectional representation of a channeled aperture with a de Laval profile; and, FIG. 4e is a schematic cross-sectional representation of a channeled aperture with a widening conical channel.

FIG. 4b is a schematic cross-sectional representation of a channeled aperture with a narrowing conical channel and an actuator used to position the channeled aperture. Unlike the frustoconical shell aperture depicted in FIG. 4a, aperture 413 has a narrow channel in a solid body, which allows droplet jet 414 to pass from the triple point chamber to the vacuum chamber. Again, aperture 413 functions as a "skimmer," but due to the narrow channel of aperture 414, the jet of gas escaping from the triple point chamber interacts with droplet jet 414 for a greater amount of time and appreciably increases the velocity of the droplets as they pass through aperture 413. The magnitude of this accelerating effect is proportional to the channel length and reverse proportional to both the initial droplet velocity and the square of droplet diameter. As an example, with a channel length of 4 cm and a droplet velocity of 20 m/s and diameter of 100 μm, traversal through aperture 413 will increase droplet velocity by approximately 0.3 m/s. However when droplet speed is reduced to 10 m/s and droplet diameter is reduced to 50 μm, passing through aperture 413 will increase droplet velocity by approximately 3 m/s.

Figure 4C:
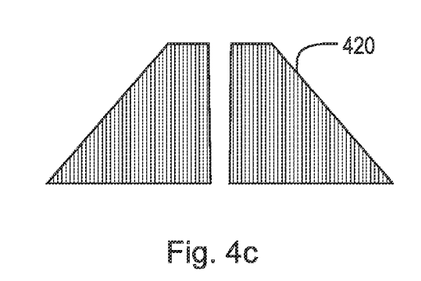
FIG. 4c is a schematic cross-sectional representation of a channeled aperture with a cylindrical channel.
Figure 4E:
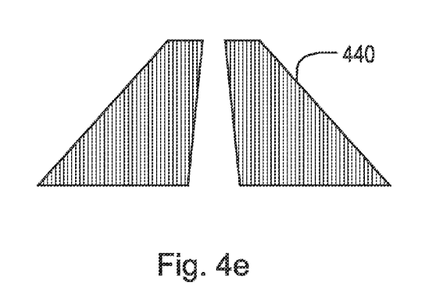

Using alternate channel geometries may also increase the magnitude of the velocity increase by a factor of 2-3, such as using a de Laval-style channel instead of a conical or cylindrical channel. Aperture 420 in FIG. 4c has a cylindrical channel, aperture 430 in FIG. 4d has a de Laval-style channel, and aperture 440 in FIG. 4e has a widening conical channel.

In addition to the accelerating effect, the escaping jet of gas may also stabilize droplet direction along the axis of the channel in the aperture due to viscous forces in the jet of gas. Referring now to FIG. 4b, entrance imaging unit 410 measures spatial information about the droplets in droplet jet 414 as they enter aperture 413. Exit imaging unit 415 measures spatial information about the droplets in droplet jet 414 as they exit aperture 413. Using this combined entrance/exit spatial information, the orientation of aperture 413, and specifically, the orientation of the central axis of the channel that runs therethrough, can be adjusted with channel actuator 412. Channel actuator 412 is pivotably connected to aperture 413, which itself is pivotably connected to fixed input orifice 411. Channel actuator 412 pivots aperture 413 on input orifice 411, thereby altering the orientation of the channel that runs through aperture 413.

Increasing the droplet velocity has several advantages in laser produced plasma EUV light sources. Given a constant droplet arrival rate at a specific point, increased droplet velocity increases the distance separating adjacent droplets, reducing the effects that plasma generation has on subsequent droplets, thereby increasing droplet accuracy within the vacuum chamber. Further, increased droplet velocity reduces the time it takes for a given droplet to travel the distance between the triple point chamber and the target spot. As discussed above, due to the very low pressure within the vacuum chamber, liquid droplets will immediate begin rapid evaporation and cooling, quickly freezing into pellets. This rapid transition can reduce the spatial and temporal stability of the droplet, causing a corresponding reduction in accuracy within the vacuum chamber. Reducing the time a given droplet or pellet spends traveling to the target spot mitigates this problem. Still further, increased droplet velocity increases the momentum of a given droplet or pellet, which reduces the influence of ions from plasma and buffer gas flow.

Although it is possible to increase the velocity of the droplets entering the vacuum chamber by increasing the pressure of the gas in the triple point chamber, this method negatively affects droplet formation within the triple point chamber by changing the environment away from the triple point of the target material. Increased pressure within the triple point chamber also increases the rate of gas flow from the triple point chamber into the vacuum chamber, increasing both the pressure within the vacuum chamber and the attenuation of the EUV light created therein.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus for generating extreme ultra-violet (EUV) light for use in a lithography mask inspection tool, comprising:
   a drive laser arranged to produce a laser pulse;
   a vacuum chamber;
   a set of focusing optics arranged to focus the laser pulse produced by the drive laser onto a target spot within the vacuum chamber with a beam target diameter of less than 100 μm;
   a target material generator arranged to deliver a series of droplets of a target material to the target spot within the vacuum chamber by modulating a flow velocity of a first supply of the target material through a nozzle tip and thereby inducing a formation process of the series of droplets of the target material which series of droplets from the nozzle tip are expelled through a triple point chamber; and,
   a set of collector optics arranged to focus a quantity of EUV light generated when a droplet of the series of droplets of the target material is exposed to the laser pulse at the target spot onto an intermediate focus spot.

2. The apparatus of claim 1, wherein the laser pulse produced by drive laser has a duration in the range of 5 ns to 50 ns.

3. The apparatus of claim 1, wherein the laser pulse is repeatedly produced by drive laser at a frequency in the range of 5 kHz to 50 kHz.

4. The apparatus of claim 1, wherein the laser pulse produced by drive laser comprises a plurality of short-duration pulses.

5. The apparatus of claim 4, wherein the plurality of short-duration pulses comprises a first at least one pulse of a first intensity and a second at least one pulse of a second intensity such that the first intensity is less than the second intensity.

6. The apparatus of claim 1, further comprising:
   an at least one supplemental drive laser; and
   a beam combiner arranged to combine a set of supplemental laser pulses produced by the at least one supplemental drive laser with the laser pulse produced by the drive laser into a combined laser pulse, wherein the combined laser pulse is focused by the set of focusing optics onto the target spot within the vacuum chamber.

7. The apparatus of claim 1, further comprising:
   a beam diagnostic tool arranged to receive the laser pulse and measure an at least one laser pulse characteristic and generate a beam quality signal; and a control system arranged to receive the beam quality signal and adjust an at least one system parameter in response to the beam quality signal.

8. The apparatus of claim 1, wherein the target material is a cryogenic liquid gas.

9. The apparatus of claim 8, wherein the target material is delivered as a pellet of solid gas.

10. The apparatus of claim 8, wherein the target material is delivered as a jet of cryogenic liquid gas.

11. The apparatus of claim 1, further comprising:
a set of projection optics arranged to collect the quantity of EUV light and project the quantity of EUV light outside the apparatus.

12. The apparatus of claim 1, wherein the drive laser is a solid state laser selected from the group consisting of Nd:YAG, Er:YAG, Yb:YAG, Ti:Sapphire, and Nd:Vanadate lasers.

13. An apparatus for generating droplets for use in a laser produced plasma extreme ultra-violet (EUV) light source, comprising:
a triple point chamber arranged to provide an environment comprising a temperature and pressure combination and having a traversal length measured axially along a central axis of the triple point chamber;
a sensor arranged within the triple point chamber and further arranged to measure the temperature and pressure combination;
an environmental control means arranged to receive a signal from the sensor and adjust the environment to conform to a predefined set of values for the temperature and pressure combination;
an exit orifice arranged at a distal end of the triple point chamber;
a source vessel arranged at a proximal end of the triple point chamber;
a nozzle tip arranged at a distal end of the source vessel;
a target material source containing a first supply of a target material arranged at the proximal end of the source vessel; and
a piezoelectric actuator arranged to modulate a flow velocity of the first supply of the target material through the nozzle tip and thereby induce a formation process of a series of droplets of the target material from the first supply of the target material from the target material source and expel the series of droplets from the nozzle tip through the triple point chamber and out the exit orifice.

14. The apparatus of claim 13, wherein the target material from the first supply of the target material is a cryogenic liquid gas.

15. The apparatus of claim 13, wherein each in the series of droplets comprise a plurality of droplets, with each droplet in the plurality of droplets having a velocity comprising both a speed and a direction such that the direction of each of the droplets in the plurality of droplets is equivalent and the speed of each droplet in the plurality of droplets is not equivalent to the speed of at least one other droplet in the plurality of droplets.

16. The apparatus of claim 15, wherein the piezoelectric actuator can modulate the flow velocity of the first supply of the target material through the nozzle tip at a fundamental frequency associated with the formation process of the series of droplets and wherein the piezoelectric actuator can further be stimulated at a secondary frequency associated with the speed of each droplet in the plurality of droplets such that a magnitude associated with the secondary frequency is substantially less than a magnitude associated with the fundamental frequency.

17. The apparatus of claim 16, wherein the relative differences in the speed of each droplet in the plurality of droplets tends to cause each of the droplets in the plurality of droplets to coalesce into a large droplet within the triple point chamber.

18. The apparatus of claim 17, wherein the large droplet is expelled from the exit orifice.

19. The apparatus of claim 18, wherein the traversal length is sufficient to allow each of the droplets in the plurality of droplets to coalesce into the large droplet prior to the expulsion of the large droplet from the exit orifice.

20. The apparatus of claim 13, wherein the traversal length is in the range of 10 cm to 30 cm.

21. The apparatus of claim 13, wherein the predefined set of values for the temperature and pressure combination are substantially similar to a triple point associated with the target material.

22. The apparatus of claim 13, wherein the triple point chamber comprises a substantially sealed volume.

23. A channeled aperture for accelerating droplets for use in a laser produced plasma extreme ultra-violet (EUV) light source, comprising:
an entrance aperture proximal to a triple point chamber;
an exit aperture distal to a triple point chamber;
a channel arranged to connect the entrance aperture to the exit aperture and having a channel profile and a channel axis;
a gas jet having a flow from the triple point chamber to a vacuum chamber and through the channel; and
a target material droplet, wherein the channel profile is arranged to accelerate the gas jet during the flow from the triple point chamber to the vacuum chamber, which acceleration of the gas jet generally accelerates the target material droplet in a direction coincident to a direction associated with the flow from the triple point chamber to the vacuum chamber.

24. The channeled aperture of claim 23, further comprising:
an entrance imaging unit arranged to measure a set of entrance spatial information about the target material droplet;
an exit imaging unit arranged to measure a set of exit spatial information about the target material droplet; and
a channel actuator arranged to adjust an orientation of the channel axis based on the set of entrance spatial information about the target material droplet and the set of exit spatial information about the target material droplet.

25. The channeled aperture of claim 23, wherein the channel profile generally narrows from the entrance aperture to the exit aperture.

26. The channeled aperture of claim 23, wherein the channel profile generally expands from the entrance aperture to the exit aperture.

27. The channeled aperture of claim 23, wherein the channel profile is generally cylindrical.

28. The channeled aperture of claim 23, wherein the channel profile is generally equivalent to a de Laval nozzle profile.

29. An apparatus for generating extreme ultra-violet (EUV) light for use in a lithography mask inspection tool, comprising:
a drive laser arranged to produce a laser pulse comprising a plurality of short-duration pulses wherein the plurality of short-duration pulses comprises a first at least one pulse of a first intensity and a second at least one pulse of a second intensity such that the first intensity is less than the second intensity;

a vacuum chamber;

a set of focusing optics arranged to focus the laser pulse produced by the drive laser onto a target spot within the vacuum chamber with a beam target diameter of less than 100 μm;

a target material generator arranged to deliver an amount of a target material to the target spot within the vacuum chamber; and, a set of collector optics arranged to focus a quantity of EUV light generated when the amount of the target material is exposed to the laser pulse at the target spot onto an intermediate focus spot.

* * * * *